(12) United States Patent
Wang et al.

(10) Patent No.: US 10,410,906 B2
(45) Date of Patent: Sep. 10, 2019

(54) SUBSTRATE SUPPORTING APPARATUS

(71) Applicant: ACM Research (Shanghai) Inc., Shanghai (CN)

(72) Inventors: Hui Wang, Shanghai (CN); Fuping Chen, Shanghai (CN); Huaidong Zhang, Shanghai (CN); Wenjun Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 0 days.

(21) Appl. No.: 14/647,729

(22) PCT Filed: Nov. 27, 2012

(86) PCT No.: PCT/CN2012/085319
§ 371 (c)(1),
(2) Date: May 27, 2015

(87) PCT Pub. No.: WO2014/082196
PCT Pub. Date: Jun. 5, 2014

(65) Prior Publication Data
US 2015/0325466 A1 Nov. 12, 2015

(51) Int. Cl.
*H01L 21/687* (2006.01)
*B23B 31/30* (2006.01)
(Continued)

(52) U.S. Cl.
CPC .... *H01L 21/6838* (2013.01); *H01L 21/67259* (2013.01); *H01L 21/6875* (2013.01);
(Continued)

(58) Field of Classification Search
CPC .... Y10T 279/11; Y10T 279/18; Y10T 279/29; B23B 31/307; B23B 2260/128;
(Continued)

(56) References Cited

U.S. PATENT DOCUMENTS 4,874,273 A 10/1989 Tokisue et al.
5,492,566 A 2/1996 Sumnitsch et al.
(Continued)

FOREIGN PATENT DOCUMENTS

CN 1577762 A 2/2005
CN 101425452 A 5/2009
(Continued)

OTHER PUBLICATIONS

Machine translation, Japan patent document, JP2004235234, (same as JP4275420), "Substrate Processor and Substrate Processing Method", Asa et al., Aug. 2004.*
(Continued)

*Primary Examiner* — Eric A. Gates
*Assistant Examiner* — Chwen-Wei Su
(74) *Attorney, Agent, or Firm* — Osha Liang LLP

(57) ABSTRACT

A substrate supporting apparatus includes a rotatable chuck, a first mass flow controller, a second mass flow controller, a plurality of locating pins and guiding pillars, and a motor in which the rotatable chuck defines a plurality of first injecting ports and second injecting ports, the first injecting ports are connected with a first gas passage for supplying gas to the substrate and sucking the substrate by Bernoulli effect, the second injecting ports are connected with a second gas passage for supplying gas to the substrate and lifting the substrate, the first and the second mass flow controllers are respectively installed on the first and the second gas passages, the plurality of locating pins and guiding pillars are disposed at the top surface of the rotatable chuck and every guiding pillar protrudes to form a holding portion, and the motor is used for rotating the rotatable chuck.

13 Claims, 9 Drawing Sheets

(51) Int. Cl.
   *H01L 21/683*   (2006.01)
   *H01L 21/67*   (2006.01)

(52) U.S. Cl.
   CPC ...... *H01L 21/68728* (2013.01); *B23B 31/307* (2013.01); *Y10T 279/11* (2015.01)

(58) Field of Classification Search
   CPC ............... B25B 11/005; H01L 21/6838; H01L 21/67259; H01L 21/68728; H01L 21/68764; H01L 21/6875
   See application file for complete search history.

(56) References Cited

U.S. PATENT DOCUMENTS

| | | | |
|---|---|---|---|
| 6,612,014 B1 * | 9/2003 | Donoso | H01L 21/67034 216/91 |
| 6,669,808 B2 | 12/2003 | Adachi et al. | |
| 7,056,392 B1 * | 6/2006 | Kuroki | H01L 21/68728 134/137 |
| 7,988,818 B2 * | 8/2011 | Engesser | H01L 21/6704 156/345.21 |
| 9,371,584 B2 * | 6/2016 | Kim | C23C 16/458 |
| 2003/0198551 A1 * | 10/2003 | Schmidt | B25J 9/0009 414/749.1 |
| 2006/0144429 A1 | 7/2006 | Langen | |
| 2008/0280453 A1 * | 11/2008 | Koelmel | H01L 21/67115 438/758 |
| 2009/0092470 A1 * | 4/2009 | Bonora | H01L 21/68707 414/226.01 |
| 2010/0052345 A1 * | 3/2010 | Chang | B25J 15/0616 294/64.3 |
| 2010/0201976 A1 * | 8/2010 | Kamiyama | H01L 21/67778 356/237.5 |
| 2012/0325275 A1 * | 12/2012 | Goodman | B23B 31/14 134/149 |
| 2013/0113169 A1 * | 5/2013 | Sugi | H01L 21/6831 279/128 |
| 2013/0127102 A1 * | 5/2013 | Kinoshita | H01L 21/6838 269/20 |

FOREIGN PATENT DOCUMENTS

| | | | | |
|---|---|---|---|---|
| CN | 101443899 A | 5/2009 | | |
| CN | 102308381 A | 1/2012 | | |
| CN | 102376532 A | 3/2012 | | |
| JP | H09107023 A | 4/1997 | | |
| JP | H11165868 A | 6/1999 | | |
| JP | 2000021951 A | 1/2000 | | |
| JP | 2003170382 A | 6/2003 | | |
| JP | 2003-203891 A | 7/2003 | | |
| JP | 2003-282515 A | 10/2003 | | |
| JP | 2003321117 A | 11/2003 | | |
| JP | 2006114640 A | 4/2006 | | |
| JP | 2006157008 A | 6/2006 | | |
| JP | 2007176637 A | 7/2007 | | |
| JP | 4275420 B2 * | 6/2009 | ....... | H01L 21/68728 |
| JP | 2010073825 A | 4/2010 | | |
| KR | 2005-0045339 A | 5/2005 | | |
| TW | 200504862 A | 2/2005 | | |
| TW | 201405699 A | 2/2014 | | |
| WO | WO 2012011149 A1 * | 1/2012 | | |

OTHER PUBLICATIONS

International Search Report issued in PCT/CN2012/085319 dated Aug. 29, 2013 (4 pages).
Written Opinion of the International Searching Authority issued in PCT/CN2012/085319 dated Aug. 29, 2013 (4 pages).
Office Action issued in Chinese Application No. 201280077307.0; dated Nov. 11, 2016 (9 pages).
Office Action issued in Japanese Application No. 2015-543233; dated Nov. 8, 2016 (8 pages).
Office Action issued in corresponding Taiwanese Application No. 103117334 dated Jul. 27, 2017 (9 pages).
Office Action issued in corresponding Chinese Application No. 201280077307.0 dated Jun. 8, 2017 (10 pages).
Office Action issued in corresponding Taiwanese Application No. 103117334 dated Dec. 12, 2017 (4 pages).
Office Action issued in corresponding Chinese Application No. 201280077307.0 dated Dec. 5, 2017, and english translation (21 pages).
Office Action issued in corresponding Korean Application No. 10-2015-7016200 dated Feb. 20, 2019, and English translation thereof (11 pages).

* cited by examiner

SUBSTRATE SUPPORTING APPARATUS

CROSS-REFERENCE TO RELATED APPLICATIONS

This is a national stage application based on PCT/CN2012/085319, filed on Nov. 27, 2012. This application claims the benefit and priority of this prior application and incorporates its disclosure by reference in its entirety.

BACKGROUND OF THE INVENTION

1. Field of the Invention

The present invention generally relates to a substrate processing apparatus, and more particularly to a substrate supporting apparatus making use of Bernoulli principle for supporting a substrate, such as a semiconductor wafer during cleaning, etching, developing, photo resist coating or removing process.

2. The Related Art

During a semiconductor device fabrication process, most treating processes used for manufacturing the semiconductor device, such as cleaning, etching, developing, photo resist coating or removing, focus on the substrate device side also referred to as the front side of the substrate. However, the substrate backside (non-device side) processing such as cleaning and etching is just as important. Contaminations attached on the backside of the substrate can cause for example photolithography steps defocus on the pattern formed on the front side of the substrate, and also can contaminate the substrate processing apparatus thereby contaminating other substrates processed by the same apparatus. Thereinto, backside metallic contaminations can diffuse through the substrate and contaminate the front side of the substrate, which would induce the semiconductor device electrical failure.

In order to ensure the quality of the semiconductor device, it is essential to clean the backside of the substrate. For cleaning the backside of the substrate, an apparatus is needed to support the substrate. Such apparatus has been known from U.S. Pat. No. 5,492,566. The apparatus comprises an annular nozzle in a circular surface of the apparatus. The nozzle is fed with compressed gas for the formation of a gas cushion between the apparatus and the substrate. The substrate is sucked above the apparatus by Bernoulli principle and keeps in a floating state. At least one projection in the apparatus topside surface serves as a rest for the substrate during processing. In the apparatus, the lower surface of the substrate facing the apparatus needs to keep contact with the projection. For the substrate backside processing, the substrate device side (front side) needs to face the apparatus topside surface. The projection may cause the device side pattern broken, and the gap height between the substrate and the apparatus topside surface is not to easily adjust.

Another apparatus for supporting a substrate is disclosed in U.S. Pat. No. 6,669,808. The apparatus provides a proximity suction member above a rotary base member having a support member supporting a substrate. The proximity suction member downwardly and outwardly injects gas from a support surface thereof to the overall peripheral edge of an upper surface of the substrate supported by the support member. The support surface being a lower surface of the proximity suction member is located on a plane substantially parallel to the substrate on the rotary base member. A processing solution supply part supplies the processing solution to a lower surface of the substrate supported and rotated on the rotary base member. Also the gap height between the lower surface of the substrate and the rotary base member topside surface is not easily to adjust. Besides the cleaning efficiency may be not so good because of the processing solution supply model.

SUMMARY

Accordingly, an object of the present invention is to provide a substrate supporting apparatus having a rotatable chuck, a first mass flow controller, a second mass flow controller, a plurality of locating pins and guiding pillars, and a motor. The rotatable chuck for supporting a substrate defines a plurality of first injecting ports and second injecting ports. The first injecting ports are connected with a first gas passage for supplying gas to the substrate and sucking the substrate by Bernoulli effect. The second injecting ports are connected with a second gas passage for supplying gas to the substrate and lifting the substrate. The first mass flow controller is installed on the first gas passage for controlling the flow of the gas supplied to the first injecting ports. The second mass flow controller is installed on the second gas passage for controlling the flow of the gas supplied to the second injecting ports. The plurality of locating pins are disposed at the top surface of the rotatable chuck for preventing the substrate horizontal movement when the substrate has a predefined process. The plurality of guiding pillars are disposed at the top surface of the rotatable chuck and every guiding pillar protrudes to form a holding portion for holding the substrate. The motor is used for rotating the rotatable chuck.

A gap is formed between the lower surface of the substrate and the top surface of the rotatable chuck, avoiding the lower surface of the substrate contacting with the top surface of the rotatable chuck thereby contaminating the lower surface of the substrate, and the height of the gap can be adjusted by controlling the flow of the gas supplied to the first injecting ports and the second injecting ports and the substrate can keep in a stably floating state by Bernoulli principle.

BRIEF DESCRIPTION OF THE DRAWINGS

The present invention will be apparent to those skilled in the art by reading the following description of a preferred embodiment thereof, with reference to the attached drawings, in which.

DETAILED DESCRIPTION OF EMBODIMENTS

Figure 1:
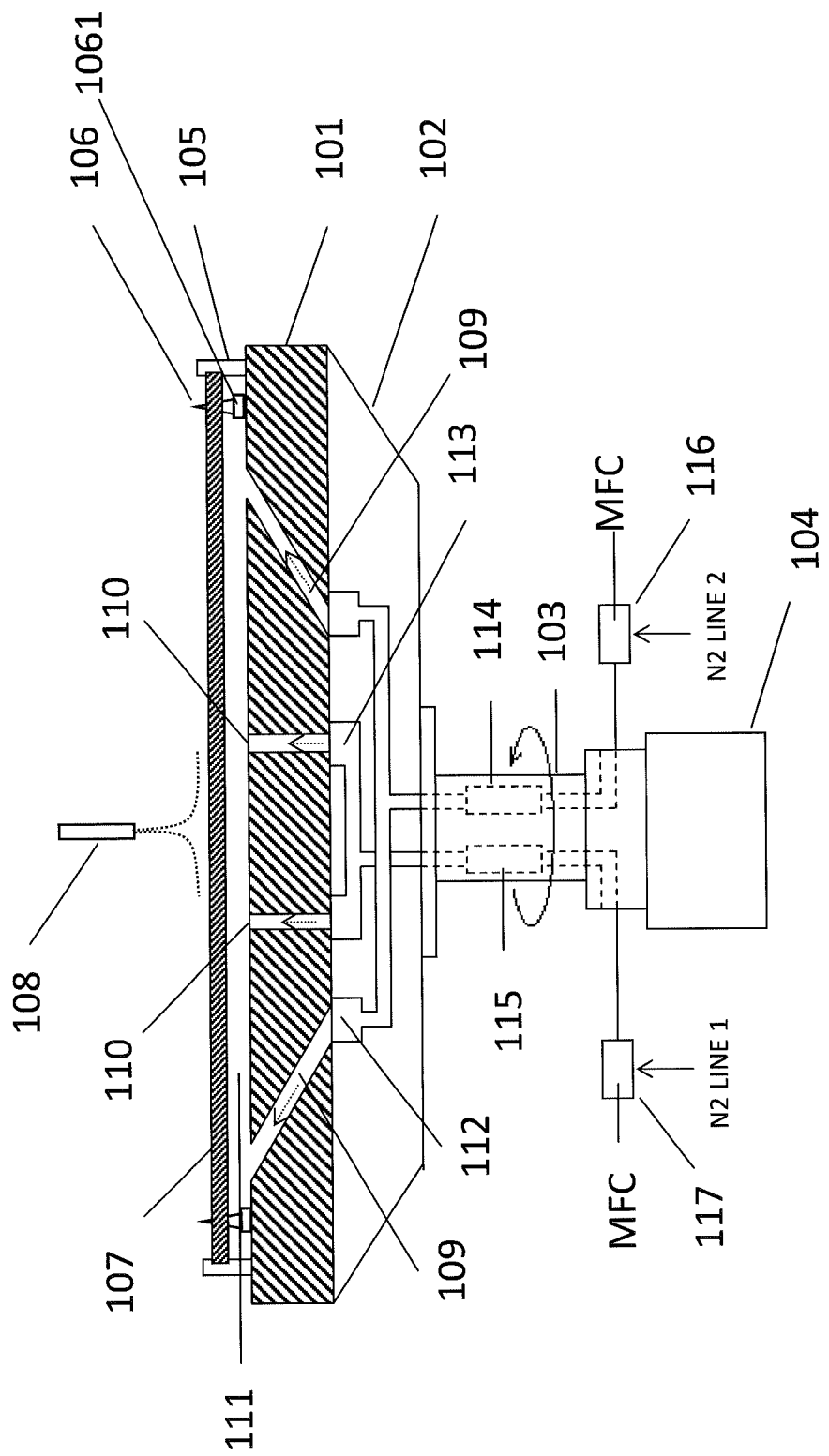
FIG. 1 is a sectional view of an exemplary substrate supporting apparatus according to the present invention.
Figure 2:
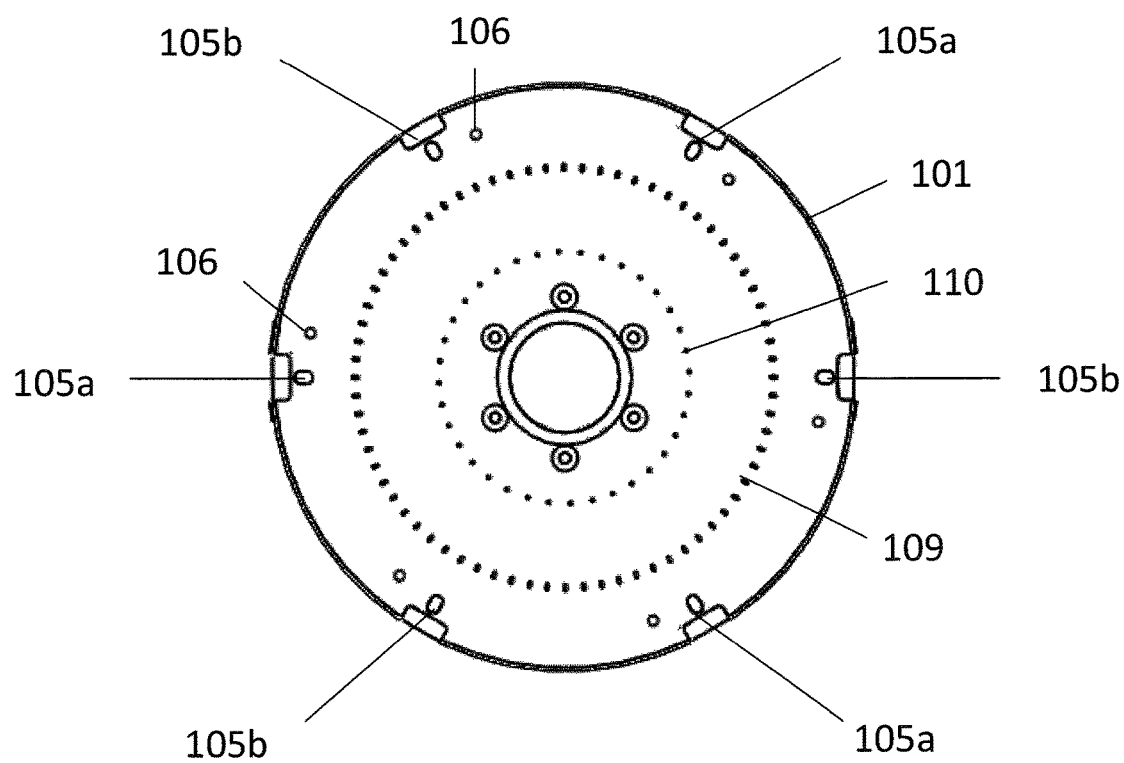
FIG. 2 is a top view of the substrate supporting apparatus.
Figure 3A:
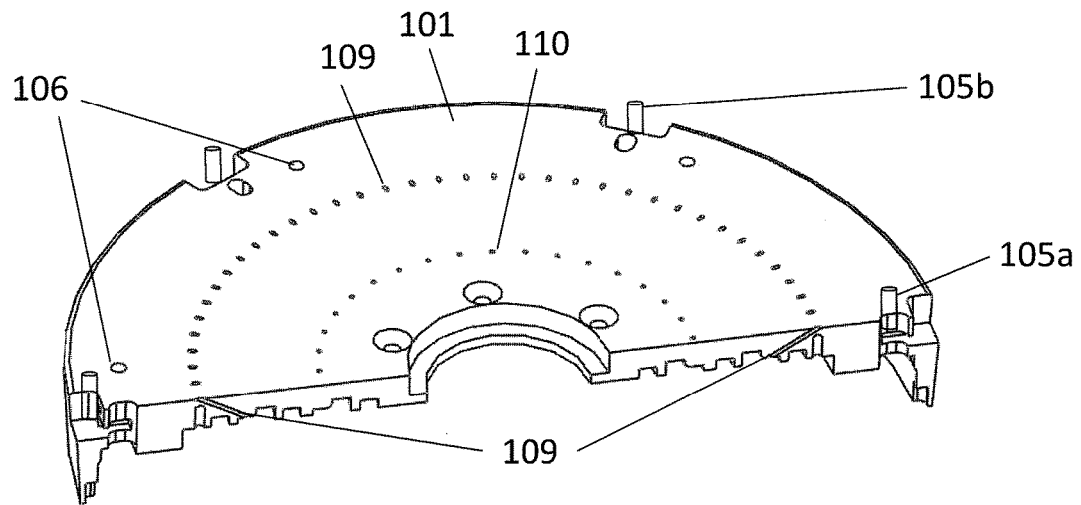
FIGS. 3A and 3B are cross-sectional views of the substrate supporting apparatus shown in FIG. 2.
Figure 3B:
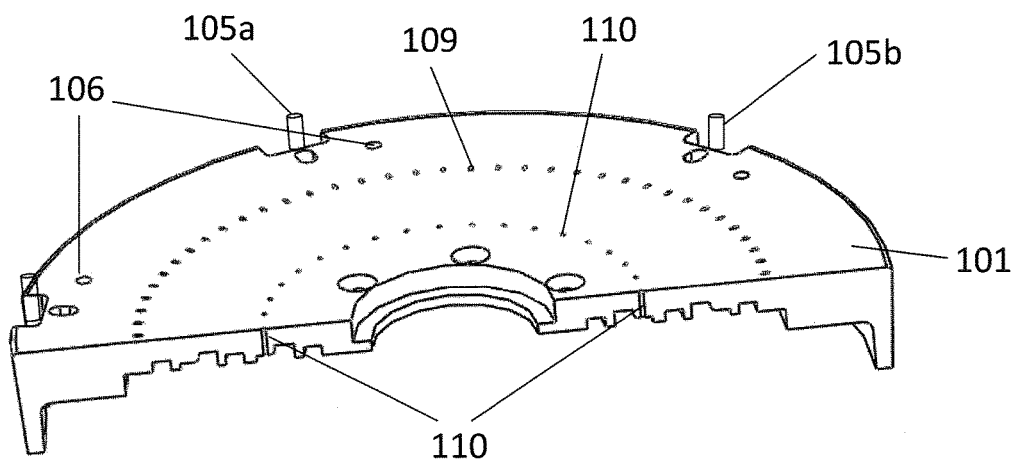
Figure 4:
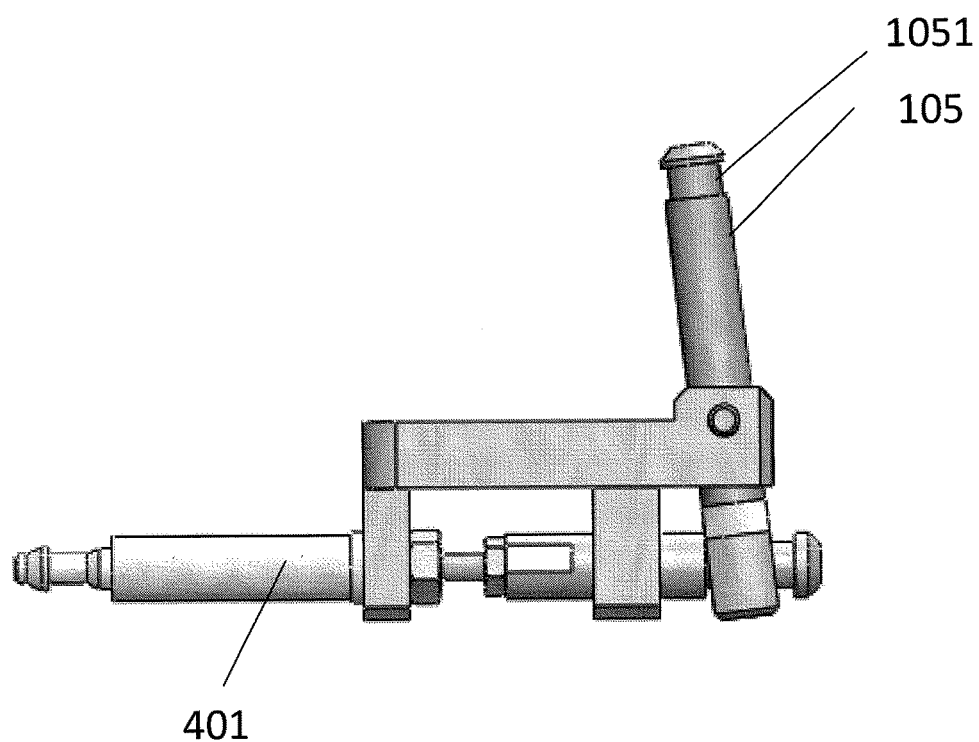
FIG. 4 is a perspective view of a locating pin of the substrate supporting apparatus.
Figure 5:
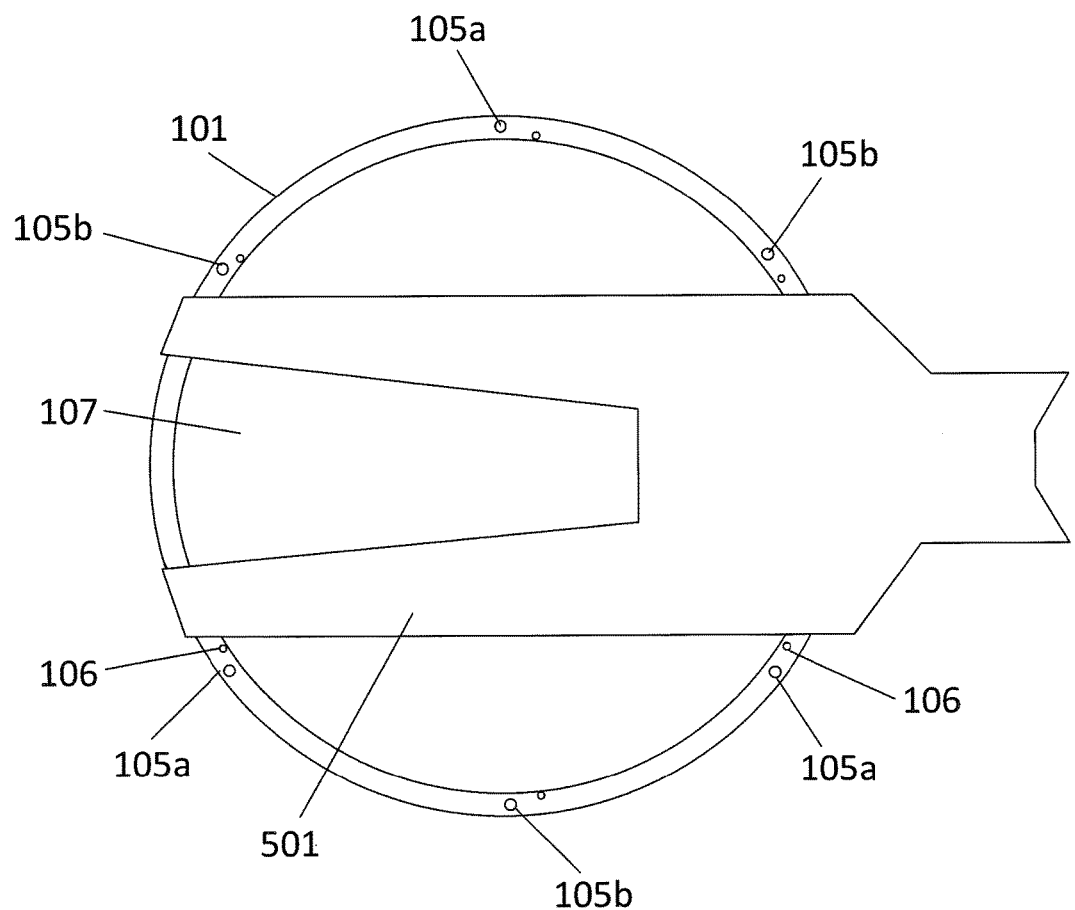
FIG. 5 is a top view showing an end-effector putting/getting a substrate on/from the substrate supporting apparatus.

Referring to FIGS. 1 to 4, a substrate supporting apparatus of the present invention is illustrated. The substrate supporting apparatus includes a rotatable chuck 101 which is optimally circular for supporting a disk-shaped article, for example, a semiconductor wafer for processing the semiconductor wafer. A hollow housing 102 is disposed below the rotatable chuck 101 and connected to the bottom surface of the rotatable chuck 101. A rotary spindle 103 is provided to connect the hollow housing 102. The rotary spindle 103 is hollow. The upper end of the rotary spindle 103 is fixed with the bottom of the hollow housing 102 and the lower end of the rotary spindle 103 is fixed with a motor 104 for rotating the rotary spindle 103 and thereby rotating the rotatable chuck 101 around a vertical axis.

A plurality of, e.g., six locating pins 105 are disposed at the outer edge of the top surface of the rotatable chuck 101 uniformly for preventing a substrate 107 horizontal movement when the substrate 107 has a predefined process such as a cleaning process. Every locating pin 105 defines a locating groove 1051 on the upper end thereof The peripheral edge of the substrate 107 is engaged with the locating groove 1051 for restricting the substrate 107 horizontal movement. Every locating pin 105 is driven by an independent cylinder 401 to move inwardly to position the substrate 107 or outwardly to release the substrate 107. All of the locating pins 105 are divided into two groups 105a, 105b which are disposed alternately. During the substrate 107 cleaning process, the two groups of locating pins 105a, 105b alternately position the substrate 107 so that the peripheral edge of the substrate 107 can be cleaned completely. That is to say, during the substrate 107 cleaning process, the first group of locating pins 105a position the substrate 107 firstly, during this time, the second group of locating pins 105b keep a non-contact state with the substrate 107, after the substrate 107 is cleaned for a period of time, the first group of locating pins 105a release the substrate 107 and the second group of locating pins 105b position the substrate 107. It should be recognized that the substrate 107 can be positioned by the second group of locating pins 105b firstly.

A plurality of, e.g., six guiding pillars 106 are disposed at the outer edge of the top surface of the rotatable chuck 101. Every guiding pillar 106 is adjacent to a corresponding locating pin 105. The guiding pillar 106 is in cone shape so the side surface of the guiding pillar 106 serves as a guiding surface for guiding the substrate 107 to be put on the rotatable chuck 101 exactly. The bottom of the guiding pillar 106 protrudes outwardly to form a holding portion 1061 for holding the substrate 107 when the substrate 107 is put on the rotatable chuck 101 so a gap 111 is formed between the lower surface of the substrate 107 and the top surface of the rotatable chuck 101, avoiding the lower surface of the substrate 107 contacting with the top surface of the rotatable chuck 101 thereby contaminating the lower surface of the substrate 107.

The rotatable chuck 101 defines a plurality of first injecting ports 109 and second injecting ports 110 passing therethrough. The first injecting ports 109 are defined on a circle on the rotatable chuck 101 and far away from the center of the rotatable chuck 101. Every first injecting port 109 is inclined and formed an angle with respect to the bottom surface of the rotatable chuck 101. The second injecting ports 110 are defined on a circle on the rotatable chuck 101 and close to the center of the rotatable chuck 101. Every second injecting port 110 is vertical and perpendicular to the rotatable chuck 101. Every first injecting port 109 is connected to a first gas pipe 112 and every second injecting port 110 is connected to a second gas pipe 113. Both the first gas pipe 112 and the second gas pipe 113 are received in the hollow housing 102 respectively. The first gas pipe 112 and the second gas pipe 113 respectively pass through the hollow housing 102 and are received in the rotary spindle 103. A first filter 114 is disposed in the first gas pipe 112 for purifying the gas supplied to the substrate 107 through the first injecting ports 109. A second filter 115 is disposed in the second gas pipe 113 for purifying the gas supplied to the substrate 107 through the second injecting ports 110. The first gas pipe 112 is connected to a first gas tube disposed outside the substrate supporting apparatus and connected to a gas source. The first gas pipe 112 and the first gas tube are formed a first gas passage connecting with the first injecting ports 109 for supplying the gas to the first injecting ports 109. A first mass flow controller (MFC) 116 is installed on the first gas passage for controlling the flow of the gas supplied to the first injecting ports 109. Specially, the first mass flow controller 116 is installed on the first gas tube for controlling the flow of the gas supplied to the first gas pipe 112. The juncture place of the first gas pipe 112 and the first gas tube is sealed by a magnetic fluid for preventing the gas leak. The second gas pipe 113 is connected to a second gas tube disposed outside the substrate supporting apparatus and connected to a gas source. The second gas pipe 113 and the second gas tube are formed a second gas passage connecting with the second injecting ports 110 for supplying the gas to the second injecting ports 110. A second mass flow controller 117 is installed on the second gas passage for controlling the flow of the gas supplied to the second injecting ports 110. Specially, the second mass flow controller 117 is installed on the second gas tube for controlling the flow of the gas supplied to the second gas pipe 113. The juncture place of the second gas pipe 113 and the second gas tube is sealed by a magnetic fluid for preventing the gas leak.

Please refer to FIG. 5 and FIGS. 6A to 6E showing a sequence of the substrate 107 backside cleaning by use of the substrate supporting apparatus. An end-effector 501 is used for carrying the substrate 107 above the rotatable chuck 101. The end-effector 501 has a base portion 601. The outer edge of the bottom surface of the base portion 601 protrudes downward to form a circular leaning portion 602 for preventing the substrate 107 from contacting with the bottom surface of the base portion 601 and thereby contaminating the substrate 107 when the end-effector 501 carries the substrate 107. A part of the leaning portion 602 further protrudes downward to form a stopping portion 605 for restricting the substrate 107 movement in the end-effector 501. The bottom surface of the leaning portion 602 disposes a contact sensor 604 for detecting whether the substrate 107 is put against the leaning portion 602. If the substrate 107 is put against the leaning portion 602, a pushing portion 603 is driven to push the substrate 107 to abut the stopping portion 605 and then the substrate 107 is located securely in the end-effector 501. The pushing portion 603 can be driven by a cylinder.

Figure 6A:
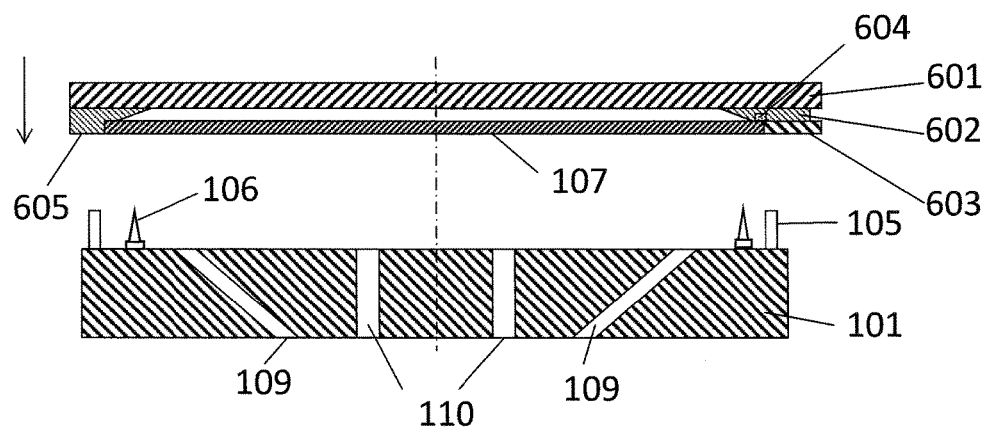
FIGS. 6A to 6E show a sequence of the end-effector putting the substrate on the substrate supporting apparatus to process.
Figure 6B:
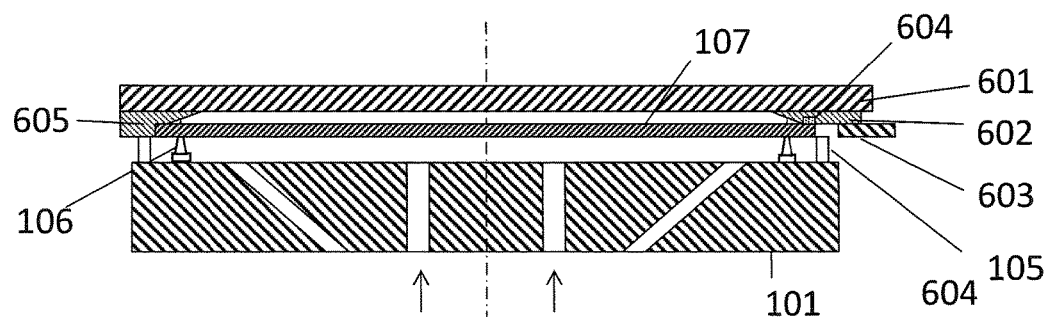
Figure 6C:
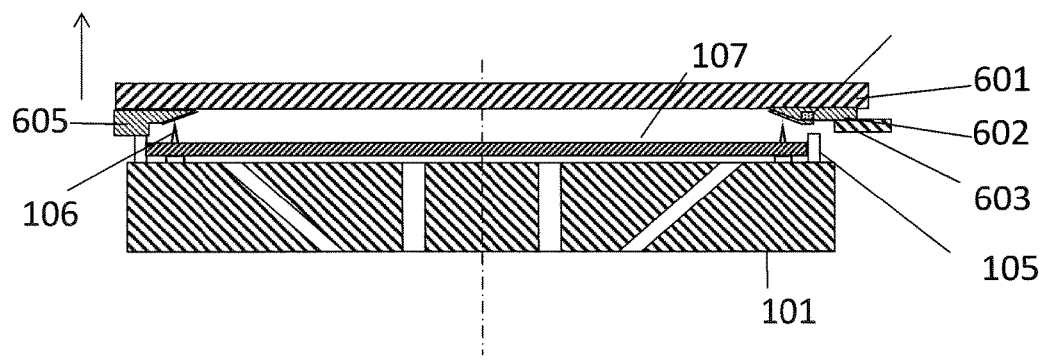
Figure 6D:
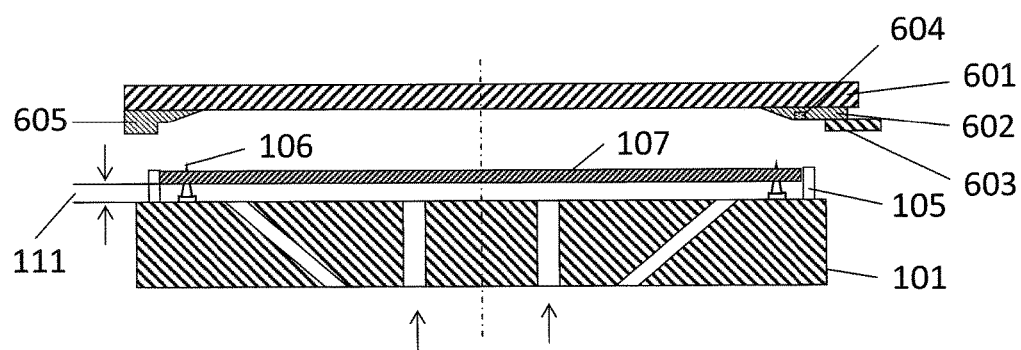
Figure 6E:
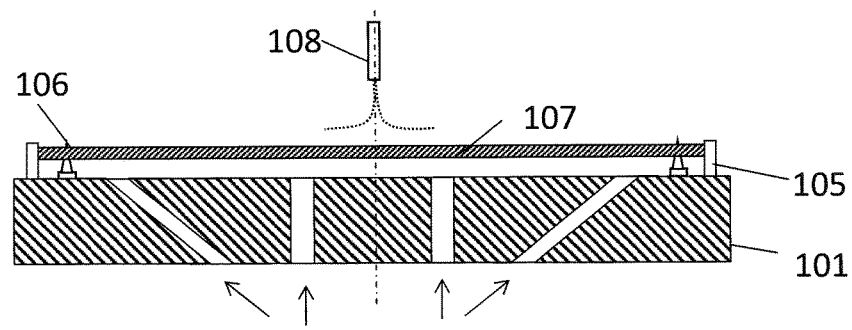

As shown in FIG. 6A, the end-effector 501 carries the substrate 107 above the rotatable chuck 101, and at this time, the first gas tube and the second gas tube are closed and it is unnecessary to supply the gas to the first injecting ports 109 and the second injecting ports 110. Then the end-effector 501 moves downward to make the substrate 107 close the guiding pillars 106. At this time, the second gas tube is opened and the gas is supplied to the front side of the substrate 107 through the second gas pipe 113 and the second injecting ports 110. For cleaning the backside of the substrate 107, the front side of the substrate 107 is arranged to face the top surface of the rotatable chuck 101. In order to avoid contaminating the front side of the substrate 107, the gas supplied to the front side of the substrate 107 is purified by the second filter 115. The gas ejected from the second injecting ports 110 lifts the substrate 107 at a predefined height and then the pushing portion 603 is pulled outwardly to release the substrate 107, as shown in FIG. 6B. Then the second gas tube is closed so the gas is stopped supplying to the substrate 107. The substrate 107 drops down to the holding portions 1061 along the side surface of the guiding pillars 106 under the action of its own gravity and is held by the holding portions 1061, which is shown in FIG. 6C. The second gas tube is opened again and the gas ejected from the second injecting ports 110 lifts the substrate 107 so that the gap 111 is formed between the front side of the substrate 107 and the top surface of the rotatable chuck 101 by adjusting the flow of the gas supplied to the second injecting ports 110 through the second mass flow controller 117, as shown in FIG. 6D. The end-effector 501 is moved away and at least one nozzle 108 is moved above the backside of the substrate 107 for spraying cleaning liquid to clean the backside of the substrate 107. When cleaning the backside of the substrate 107, the first gas tube is opened and the gas is ejected through the first injecting ports 109 for sucking the substrate 107 by Bernoulli effect. Therefore, the substrate 107 can keep in a stably floating state for backside cleaning The first group of locating pins 105a position the substrate 107 while the motor 104 rotates the rotatable chuck 101 and the nozzle 108 sprays the cleaning liquid to clean the backside of the substrate 107. Because of the rotatable chuck 101 rotating and the gas outward ejected from the first injecting ports 109, the cleaning liquid sprayed to the backside of the substrate 107 is prevented by the flow of the gas from reaching the front side of the substrate 107. After cleaning a period of time, the second group of locating pins 105b replace the first group of locating pins 105a to position the substrate 107, by this way, the peripheral edge of the substrate 107 can be cleaned completely.

Figure 7A:
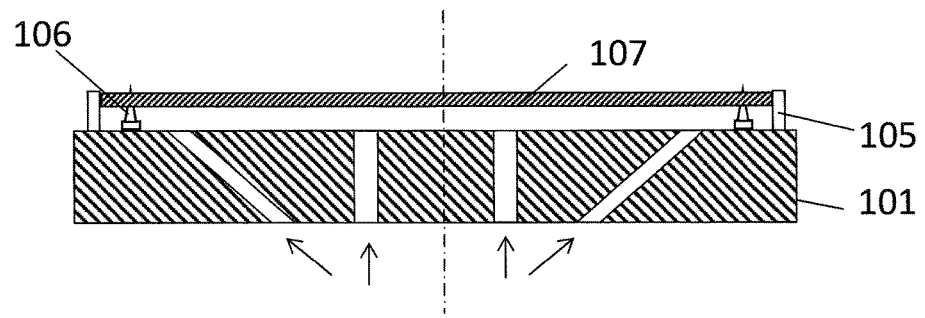
FIGS. 7A to 7F show a sequence of the end-effector getting the substrate from the substrate supporting apparatus.
Figure 7B:
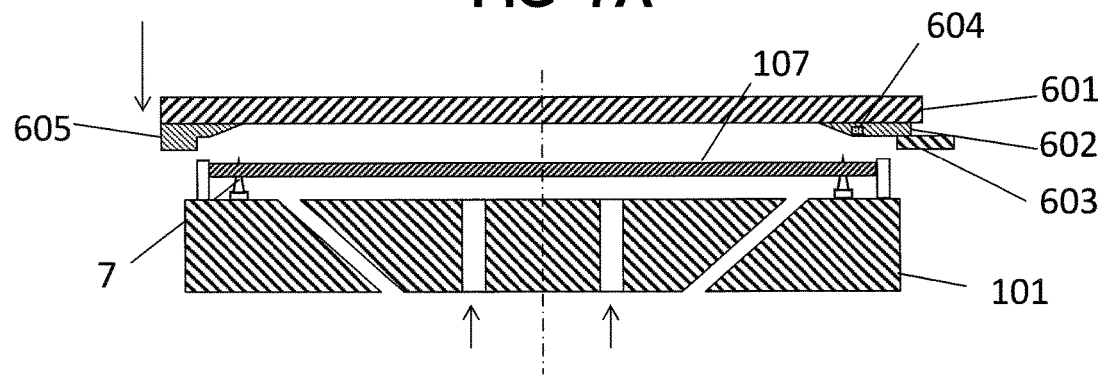
Figure 7C:
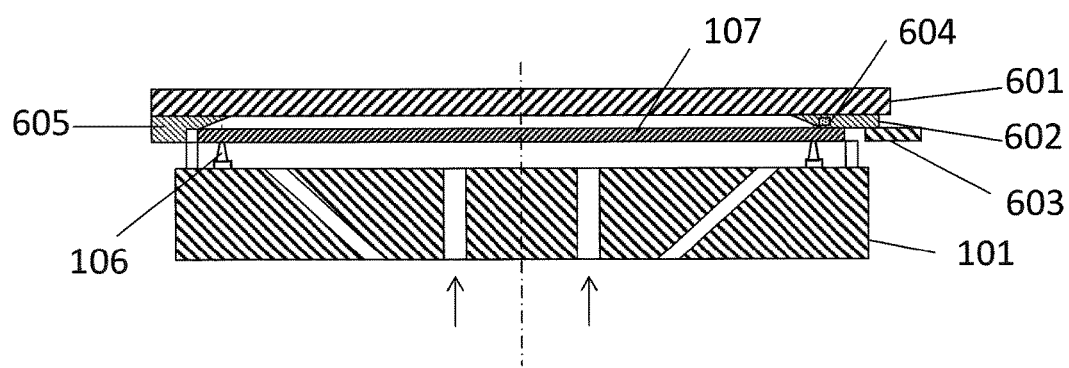
Figure 7D:
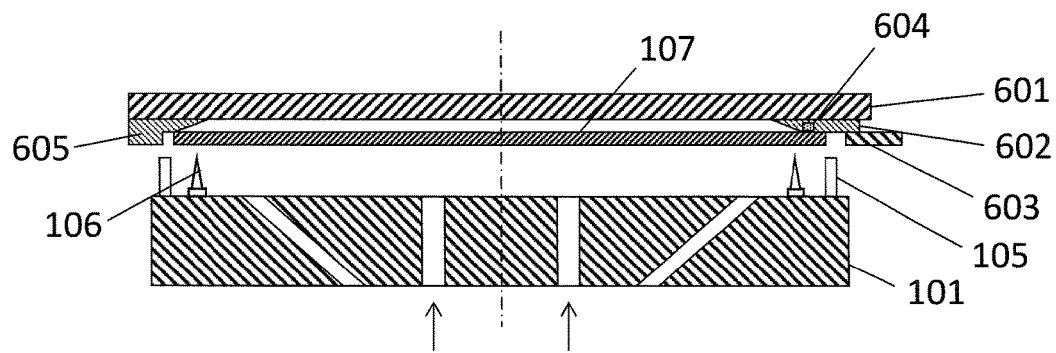
Figure 7E:
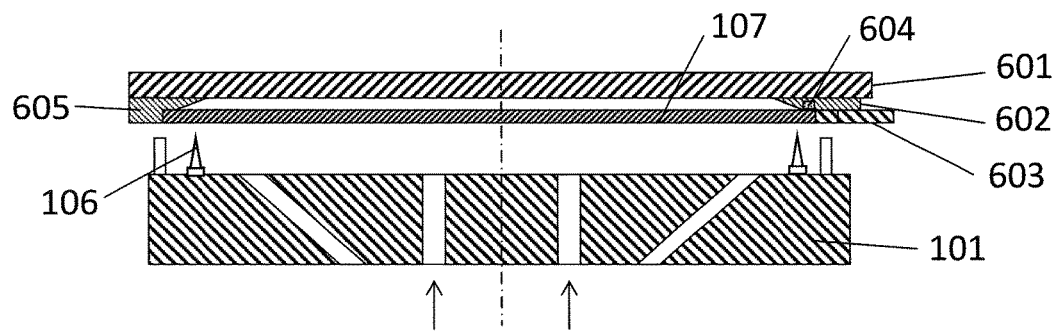
Figure 7F:
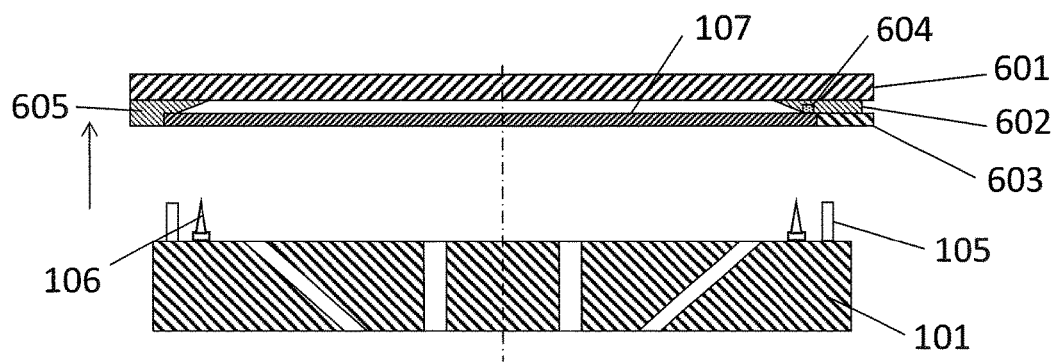

Referring to FIGS. 7A to 7F, after the backside of the substrate 107 cleaned, the nozzle 108 is moved away. The end-effector 501 is moved above the backside of the substrate 107 and the first gas tube is closed so the gas is stopped supplying to the substrate 107 through the first injecting ports 109. The second gas tube still keeps open to supply the gas to lift the substrate 107, as shown in FIG. 7B. The end-effector 501 moves downward to close the substrate 107. Then the flow of the gas supplied to the substrate 107 through the second injecting ports 110 is increased by the second mass flow controller 117 and the substrate 107 rises to reach the bottom surface of the leaning portion 602, as shown in FIG. 7C. The end-effector 501 moves upward and the substrate 107 also rises against the bottom surface of the leaning portion 602 by the gas, as shown in FIG. 7D. The contact sensor 604 detects the substrate 107 so the pushing portion 603 pushes the substrate 107 to abut the stopping portion 605 and then the substrate 107 is located securely in the end-effector 501, as shown in FIG. 7E. Finally, the second gas tube is closed and the substrate 107 is moved away by the end-effector 501, as shown in FIG. 7F.

In the above description, the gas can be inert gas such as nitrogen gas. The choice of the gas is depended on the requirements of the process. Besides, the height of the gap 111 between the lower surface of the substrate 107 and the top surface of the rotatable chuck 101 can be adjusted by controlling the flow of the gas supplied to the first injecting ports 109 and the second injecting ports 110 and the substrate 107 can keep in a stably floating state by Bernoulli principle. Furthermore, the first gas tube is only opened at the time that the cleaning liquid is supplied to clean the backside of the substrate 107, which can reduce the cost of the substrate 107 backside cleaning. It should be recognized that the substrate supporting apparatus not only suits the backside cleaning, but also suits such as etching process.

The foregoing description of the present invention has been presented for purposes of illustration and description. It is not intended to be exhaustive or to limit the invention to the precise form disclosed, and obviously many modifications and variations are possible in light of the above teaching Such modifications and variations that may be apparent to those skilled in the art are intended to be included within the scope of this invention as defined by the accompanying claims.

What is claimed is:

1. A substrate supporting apparatus, comprising:
   a rotatable chuck for supporting a substrate, defining a plurality of first injecting ports and second injecting ports, the first injecting ports being inclined and forming an angle with respect to the bottom surface of the rotatable chuck, the first injecting ports connecting with a first gas passage for supplying gas to the substrate and sucking the substrate by Bernoulli effect, the second injecting ports connecting with a second gas passage for supplying gas to the substrate and lifting the substrate, wherein the second injecting ports are disposed in an inner side of the first injecting ports with respect to the center of the rotatable chuck;
   a first mass flow controller installed on the first gas passage for controlling a flow of the gas supplied to the first injecting ports, wherein the flow of the gas outward ejected from the first injecting ports prevents a cleaning liquid sprayed to the upward backside of the substrate from reaching the downward front side of the substrate;
   a second mass flow controller installed on the second gas passage for controlling a flow of the gas supplied to the second injecting ports;
   a gap formed between the substrate and the rotatable chuck, wherein the gap is adjustable by adjusting the flow of the gas supplied to the second injecting ports through the second mass flow controller;
   a plurality of locating pins disposed at the top surface of the rotatable chuck for preventing the substrate horizontal movement when the substrate has a predefined process, wherein the locating pin is engaged with a peripheral edge of the substrate, and all of the locating pins are divided into two groups which are disposed alternately, the two groups of locating pins alternately position the substrate;
   a plurality of guiding pillars disposed at the top surface of the rotatable chuck, every guiding pillar protruding to form a holding portion for holding the substrate;
   a motor for rotating the rotatable chuck; and
   an end-effector for carrying the substrate, wherein the end-effector has a base portion, a bottom surface of the base portion protrudes downward to form a leaning portion, a part of the leaning portion further protrudes downward to form a stopping portion, and a pushing portion is provided to push the substrate to abut the stopping portion to locate the substrate securely in the end-effector or pulled to release the substrate;
   a contact sensor disposed on the bottom surface of the leaning portion for detecting whether the substrate is against the leaning portion; and
   wherein:
      the end-effector is configured to be moved above the backside of the substrate after the backside of the substrate is cleaned, the flow of the gas through the first injecting ports is stopped supplying to the substrate the flow of the gas through the second injecting ports is kept supplying to the substrate so as to lift the substrate, and the end-effector is configured to move downward to close the substrate, the flow of the gas supplied to the substrate through the second injecting ports is increased so that the substrate rises to reach the bottom surface of the leaning portion, and the contact sensor is configured to detect the substrate so the pushing portion pushes the substrate to abut the stopping portion, such that the substrate is located securely in the end-effector and the flow of the gas through the second injecting ports is stopped supplying to the substrate.

2. The substrate supporting apparatus as claimed in claim 1, wherein the first injecting ports are defined on a circle on the rotatable chuck and far away from the center of the rotatable chuck, the second injecting ports are defined on a circle on the rotatable chuck and close to the center of the rotatable chuck.

3. The substrate supporting apparatus as claimed in claim 1, wherein every first injecting port is inclined and formed an angle with respect to the bottom surface of the rotatable chuck.

4. The substrate supporting apparatus as claimed in claim 1, wherein every second injecting port is vertical and perpendicular to the rotatable chuck.

5. The substrate supporting apparatus as claimed in claim 1, wherein the first gas passage is composed of a first gas pipe and a first gas tube, the first gas pipe is connected to the first injecting ports, the first gas tube is connected to the first gas pipe and a gas source, the second gas passage is composed of a second gas pipe and a second gas tube, the second gas pipe is connected to the second injecting ports, the second gas tube is connected to the second gas pipe and a gas source.

6. The substrate supporting apparatus as claimed in claim 5, wherein the bottom surface of the rotatable chuck is connected to a hollow housing, a rotary spindle is provided to connect the hollow housing, the upper end of the rotary spindle is fixed with the bottom of the hollow housing and the lower end of the rotary spindle is fixed with the motor, both the first gas pipe and the second gas pipe are received in the hollow housing, the first gas pipe and the second gas pipe respectively pass through the hollow housing and are received in the rotary spindle.

7. The substrate supporting apparatus as claimed in claim 5, further comprising a first filter disposed in the first gas pipe for purifying the gas supplied to the substrate through the first injecting ports, and a second filter disposed in the second gas pipe for purifying the gas supplied to the substrate through the second injecting ports.

8. The substrate supporting apparatus as claimed in claim 5, wherein the juncture place of the first gas pipe and the first gas tube is sealed by a magnetic fluid for preventing the gas leak, and the juncture place of the second gas pipe and the second gas tube is sealed by another magnetic fluid for preventing the gas leak.

9. The substrate supporting apparatus as claimed in claim 5, wherein the first mass flow controller is installed on the first gas tube, the second mass flow controller is installed on the second gas tube.

10. The substrate supporting apparatus as claimed in claim 1, wherein every locating pin defines a locating groove, the peripheral edge of the substrate is engaged with the locating groove for restricting the substrate horizontal movement.

11. The substrate supporting apparatus as claimed in claim 1, wherein every locating pin is driven by an independent cylinder to move inwardly to position the substrate or outwardly to release the substrate.

12. The substrate supporting apparatus as claimed in claim 1, wherein the side surface of every guiding pillar serves as a guiding surface for guiding the substrate to be put on the holding portion exactly.

13. The substrate supporting apparatus as claimed in claim 1, wherein the end-effector is configured to move upward such that the flow of the gas through the second injecting ports causes the substrate to rise with the end-effector against the bottom surface of the leaning portion.

* * * * *